United States Patent
Mukophadhyay et al.

(10) Patent No.: US 7,948,319 B2
(45) Date of Patent: May 24, 2011

(54) CURRENT-MIRRORING SYSTEMS AND METHODS

(75) Inventors: Rajarshi Mukophadhyay, Richardson, TX (US); Sharifi Reza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 12/432,414

(22) Filed: Apr. 29, 2009

(65) Prior Publication Data
US 2010/0277239 A1    Nov. 4, 2010

(51) Int. Cl.
*H03F 3/04*    (2006.01)
(52) U.S. Cl. ......................................... 330/288; 330/283
(58) Field of Classification Search .................. 330/257, 330/283, 288
See application file for complete search history.

(56) References Cited

U.S. PATENT DOCUMENTS

| | | | | |
|---|---|---|---|---|
| 5,399,991 | A | * | 3/1995 | Moraveji ...................... 330/257 |
| 5,907,262 | A | * | 5/1999 | Graeme et al. ................ 330/257 |
| 5,910,780 | A | | 6/1999 | Tam |

* cited by examiner

*Primary Examiner* — Khanh V Nguyen
(74) *Attorney, Agent, or Firm* — Dawn V. Stephens; Wade James Brady, III; Frederick J. Telecky, Jr.

(57) ABSTRACT

One embodiment of the invention includes a current-mirror system. The system includes a current-mirror circuit configured to conduct an input current through a first current path that includes a first degeneration resistance device and to generate an output current that flows through a second current path that includes a second degeneration resistance device. The output current can be substantially proportional to the input current. The system also includes a degeneration control circuit configured to maintain a substantially constant degeneration voltage across each of the first and second degeneration resistance devices.

20 Claims, 5 Drawing Sheets

CURRENT-MIRRORING SYSTEMS AND METHODS

TECHNICAL FIELD

This invention relates to electronic circuits, and more specifically to current-mirroring systems and methods.

BACKGROUND

There are many electronic devices and applications that implement current-mirroring to generate a resultant current having a magnitude proportional to a given first current. As an example, in preamplifier applications, an output bias current can be provided by a current digital-to-analog-converter (DAC) that varies widely in magnitude. Thus, current-mirroring can be implemented to substantially copy the output bias current, or to amplify the output bias current by a proportionality factor (e.g., greater than one).

A typical current-mirror configuration can include a pair of transistors that share a bias node. Thus, the pair of transistors are biased substantially the same. The current flow characteristic through each of the transistors can be based on a relative size of the transistors. Therefore, the relative size of the transistors can define a proportionality constant that substantially equally defines a relative magnitude of the current that flows through each of the transistors. Accordingly, device scaling can be implemented to amplify a given current in providing an output current from a current-mirror system.

SUMMARY

One embodiment of the invention includes a current-mirror system. The system includes a current-mirror circuit configured to conduct an input current through a first current path that includes a first degeneration resistance device and to generate an output current that flows through a second current path that includes a second degeneration resistance device. The output current can be substantially proportional to the input current. The system also includes a degeneration control circuit configured to maintain a substantially constant degeneration voltage across each of the first and second degeneration resistance devices.

Another embodiment of the invention includes a method for mirroring an input current to generate an output current. The method includes conducting the input current through a first current path that includes a first transistor arranged in series with a first degeneration resistance device. The method also includes conducting the output current through a second current path that includes a second transistor arranged in series with a second degeneration resistance device to set the output current to be substantially proportional to the input current. The first and second transistors can be connected as a current-mirror. The method further includes providing at least one control signal to the first and second degeneration resistance devices to set a substantially constant magnitude of a degeneration voltage across each of the first and second degeneration resistance devices.

Another embodiment of the invention includes a current-mirror system. The system includes means for generating an input current through a first degeneration resistance device and means for generating an output current having a magnitude that is substantially proportional to a magnitude of the input current through a second degeneration resistance device. The system also includes means for maintaining a substantially constant degeneration voltage at a first output node associated with the means for generating the input current and means for maintaining the substantially constant degeneration voltage at a second output node associated with the means for generating the output current.

DETAILED DESCRIPTION

The invention relates to electronic circuits, and more specifically to current-mirroring systems and methods. A current-mirror system includes a current-mirror circuit and a degeneration control circuit. The current-mirror circuit is configured to conduct an input current through a first current path that includes a first transistor device and a first degeneration resistance device. The current-mirror circuit is also configured to conduct an output current through a second current path that includes a second transistor device and a second degeneration resistance device. The first and second degeneration resistance devices can be constant resistance devices, such as resistors, or can be variable resistance devices, such as metal oxide semiconductor field effect transistors (MOSFETs). As an example, the first and second degeneration resistance devices can respectively interconnect the first and second transistor devices with a voltage rail. The first and second degeneration resistance devices can substantially minimize proportionality error of the output current relative to the input current resulting from process mismatch of the second transistor device relative to the first transistor device.

For example, a current mirror can be used for applications that include a wide range of input currents to be mirrored, such as between approximately 0.1 mA and 1 mA. In typical current mirrors, a degeneration voltage across a degeneration resistor can vary depending on the input current magnitude. In other words, the degeneration voltage can be directly proportional to the input current for a fixed degeneration resistance. Due to voltage headroom limitations in modern low supply voltage applications, the degeneration resistance can generally be designed for the maximum input current. For example, for an input current of approximately 1 mA with a degeneration resistance designed at approximately 300Ω, the degeneration voltage can be approximately 300 mV. However, for an input current of approximately 0.1 mA, the degeneration voltage can be approximately 3 mV, which may not be high enough to maintain sufficient mirroring accuracy in case of process variations and mismatch between input and output current mirror transistors. Therefore, such a low degeneration voltage resulting from a low input current can degrade the mirroring accuracy between the input and output currents based on any process mismatch between the input and output current mirroring devices.

Figure 1:
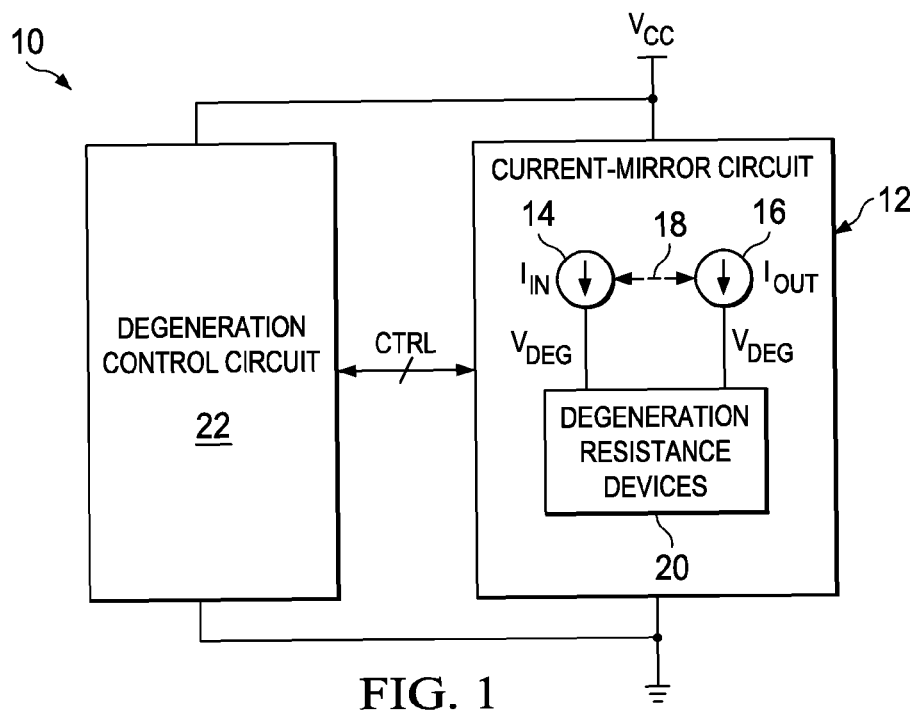
FIG. 1 illustrates an example of a current-mirror system in accordance with an aspect of the invention.

FIG. 1 illustrates an example of a current-mirror system 10 in accordance with an aspect of the invention. The current-mirror system 10 can be implemented in any of a variety of electronic applications, such as amplifier and preamplifier systems. The current-mirror system 10 includes a current-mirror circuit 12 that is interconnected between a high rail voltage $V_{CC}$ and a low rail voltage, demonstrated in the example of FIG. 1 as ground.

The current-mirror circuit 12 includes an input current source 14 that is configured to conduct an input current $I_{IN}$ and an output current source 16 that is configured to conduct an output current $I_{OUT}$. The input and output current sources 14 and 16 can be transistor devices, such as heterojunction bipolar transistors (HBTs), that are connected in a current-mirror arrangement, indicated schematically by a dashed line 18. As an example, the transistor devices of the input and output current sources 14 and 16 can have a size relationship that is defined by a proportionality constant. Therefore, the magnitude of the output current $I_{OUT}$ can be proportional with respect to the magnitude of the input current $I_{IN}$ based on the proportionality constant.

The current-mirror circuit 12 also includes degeneration resistance devices 20. As an example, the degeneration resistance devices 20 can be implemented as a pair of constant resistance devices, such as resistors, or can be implemented as a pair of variable resistance devices, such as transistors (e.g., field effect transistors (FETs)), that are each coupled to the input current source 14 and the output current source 16, respectively. As another example, the degeneration resistance devices 20 can be implemented as a hybrid combination of constant and variable resistance devices, such as series connected resistors and FETs. The degeneration resistance devices 20 can be respectively interconnected between the first and second current sources 14 and 16 and ground. The degeneration resistance devices 20 can be configured to substantially minimize proportionality error of the output current $I_{OUT}$ relative to the input current $I_{IN}$ at substantially all ranges of magnitude of the input current $I_{IN}$, as described herein.

The current-mirror system 10 also includes a degeneration control circuit 22 that is likewise interconnected between the high rail voltage $V_{CC}$ and ground. In the example of FIG. 1, the degeneration control circuit 22 is configured to generate one or more control signals CTRL that are configured to set a substantially constant magnitude of a degeneration voltage $V_{DEG}$ between the degeneration resistance devices 20 and the respective input and output current sources 14 and 16. The substantially constant magnitude of the degeneration voltage $V_{DEG}$ can be high enough to maintain sufficient current mirror accuracy, even at low magnitudes of the input current $I_{IN}$.

As an example, the one or more control signals CTRL can be a set of compensation currents that are each configured to set a substantially constant magnitude of a degeneration voltage $V_{DEG}$ across the degeneration resistance devices 20 that are configured as degeneration resistors. As another example, the one or more control signals CTRL can be a bias voltage that sets a resistance magnitude of the degeneration resistance devices 20 that are configured as degeneration transistors to set a substantially constant magnitude of a degeneration voltage $V_{DEG}$ across the degeneration transistors. For a given mirroring ratio, the degeneration voltage $V_{DEG}$ can thus be set according to the DAC current setting over the range of low and high current settings (e.g., 0.1 mA and 1.0 mA).

Based on the substantially constant magnitude of a degeneration voltage $V_{DEG}$ between the degeneration resistance devices 20 and the respective input and output current sources 14 and 16, the proportionality of the output current $I_{OUT}$ relative to the input current $I_{IN}$ can be maintained across a wide range of the input current $I_{IN}$. Accordingly, errors in the output current $I_{OUT}$ resulting from extreme sensitivity of the current-mirror system 10 to process errors in the size relationship of the transistor devices in the output current source 16 relative to the input current source 14 at very low magnitudes of the input current $I_{IN}$ (e.g., approximately 0.1 mA) can be substantially mitigated.

It is to be understood that the current-mirror system 10 is not intended to be limited to the example of FIG. 1. As an example, the input current $I_{IN}$ can be generated as a result of an input signal, such as an analog voltage or a current generated from a digital-to-analog converter (DAC), which has been omitted in the example of FIG. 1. As another example, the current-mirror system 10 can be interconnected between different voltages, such as between ground at a high voltage rail and a negative voltage magnitude at a low voltage rail. Therefore, the current-mirror system 10 can be configured in any of a variety of ways.

Figure 2:
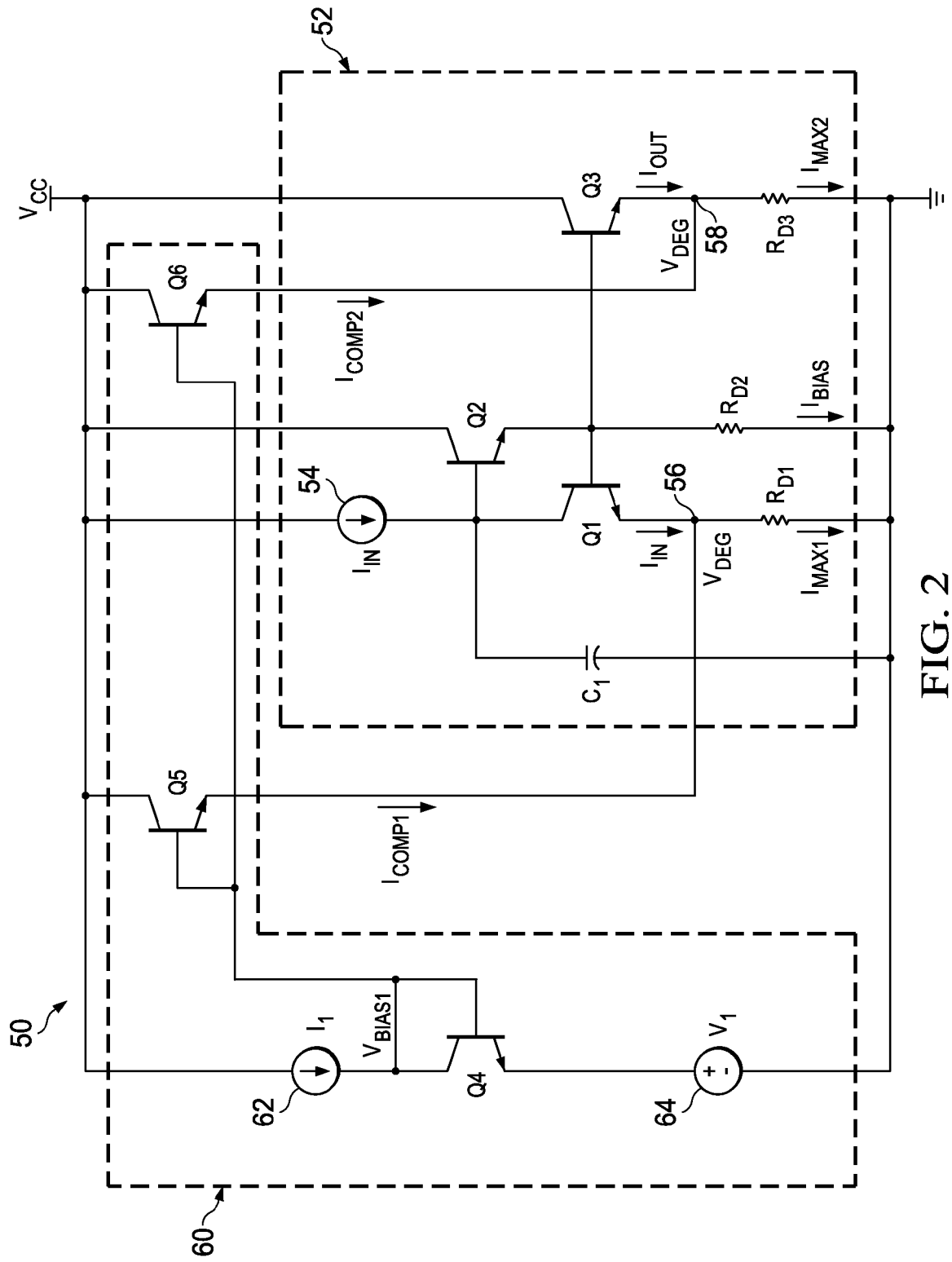
FIG. 2 illustrates another example of a current-mirror system in accordance with an aspect of the invention.

FIG. 2 illustrates an example of a current-mirror system 50 in accordance with an aspect of the invention. As an example, the current-mirror system 50 can be a more detailed example of the current-mirror system 10 in the example of FIG. 1.

The current-mirror system 50 includes a current-mirror circuit 52. The current-mirror circuit 52 includes a current source 54 that is configured to generate an input current $I_{IN}$. As an example, the current source 54 can be a current DAC, such as to generate the input current $I_{IN}$ at a magnitude that is set based on a digital signal (not shown). The input current $I_{IN}$ flows from the high rail voltage $V_{CC}$ through a first HBT Q1 to a first degeneration resistor $R_{D1}$ that is coupled to an emitter of the first HBT Q1. The current-mirror circuit 52 also includes a second HBT Q2 that is configured to set a bias for the first HBT Q1. The second HBT Q2 has a base that is coupled to the collector of the first HBT Q1 and an emitter that is coupled to the base of the first HBT Q1. A current $I_{BIAS}$ flows through the second HBT and through a second degeneration resistor $R_{D2}$, such that the first HBT Q1 remains activated and conducting the input current $I_{IN}$. In addition, in the example of FIG. 2, a capacitor $C_1$ interconnects the collector of the first HBT Q1 and ground, thus stabilizing the voltage at the collector of the first HBT Q1.

The current-mirror system 50 also includes a third HBT Q3 having a base that is coupled to the base of the first HBT Q1 and the emitter of the second HBT Q2. Thus, the output current $I_{OUT}$ flows from the high rail voltage $V_{CC}$ through the third HBT Q3 and to a third degeneration resistor $R_{D3}$ that is coupled to an emitter of the third HBT Q3. The third HBT Q3 can have a size relationship relative to the first HBT Q1 that is defined by a proportionality constant. Therefore, the output current $I_{OUT}$ can be proportional with respect to the input current $I_{IN}$ based on the proportionality constant. Furthermore, the third degeneration resistor $R_{D3}$ can have a resistance that is approximately equal to the resistance of the first degeneration resistor $R_{D1}$ divided by the proportionality constant. Accordingly, an approximately equal degeneration voltage $V_{DEG}$ is exhibited at a node 56 across the first degeneration resistor $R_{D1}$ relative and at a node 58 across the third degeneration resistor $R_{D3}$ relative to ground.

The current-mirror system 50 also includes a current compensation circuit 60. The current compensation circuit 60 includes a bias current source 62 that is configured to generate a bias current $I_1$. As an example, the bias current $I_1$ can have a substantially constant magnitude. The current compensation circuit 60 also includes a fourth HBT Q4. The fourth HBT Q4 is diode-connected, such that the fourth HBT Q4 has a common base-collector. The current compensation circuit 60 also includes a voltage source 64 that provides a voltage $V_1$ to the emitter of the fourth HBT Q4. As an example, the voltage $V_1$ can have a magnitude that is set to a desired magnitude of the degeneration voltage $V_{DEG}$, and can be static or programmable. Therefore, based on the flow of the current $I_1$ through the fourth HBT Q4, the common base-collector of the fourth HBT Q4 has a substantially constant voltage $V_{BIAS1}$ that is approximately one "diode-drop" (e.g., approximately 0.7 volts) greater than the voltage $V_1$, which is set to the degeneration voltage $V_{DEG}$.

The current compensation circuit 60 also includes a fifth HBT Q5 and a sixth HBT Q6. Each of the fifth and sixth HBTs Q5 and Q6 has a base that is coupled to the base-collector of the fourth HBT Q4. The fifth HBT Q5 conducts a first compensation current $I_{COMP1}$ from the high rail voltage $V_{CC}$ to the node 56 where it is added to the input current $I_{IN}$. Therefore, a current $I_{MAX1}$ that is a sum of the first compensation current $I_{COMP1}$ and the input current $I_{IN}$ flows through the first degeneration resistor $R_{D1}$. Similarly, the sixth HBT Q6 conducts a second compensation current $I_{COMP2}$ from the high rail voltage $V_{CC}$ to the node 58 where it is added to the output current $I_{OUT}$. Therefore, a current $I_{MAX2}$ that is a sum of the second compensation current $I_{COMP2}$ and the output current $I_{OUT}$ flows through the third degeneration resistor $R_{D3}$.

As an example, the second compensation current $I_{COMP2}$ can have a magnitude that is based on the proportionality constant relative to the first compensation current $I_{COMP1}$. Therefore, the degeneration voltage $V_{DEG}$ at the node 56 can be approximately equal to the degeneration voltage $V_{DEG}$ at the node 58 and can be substantially constant based on having a magnitude that is approximately one "diode-drop" less than the voltage $V_{BIAS1}$. Accordingly, the magnitude of the first and second compensation currents $I_{COMP1}$ and $I_{COMP2}$ can be inversely proportional to the magnitudes of the input and output currents $I_{IN}$ and $I_{OUT}$, respectively, to maintain the substantially constant degeneration voltage $V_{DEG}$ across the respective degeneration resistors $R_{D1}$ and $R_{D3}$. As a result, the proportionality of the output current $I_{OUT}$ relative to the input current $I_{IN}$ can be maintained across the entire range of input current $I_{IN}$. Accordingly, errors in the output current $I_{OUT}$ resulting from the size relationship of the HBTs Q1 and Q3 at very low magnitudes of the input current $I_{IN}$ can be substantially mitigated.

Figure 3:
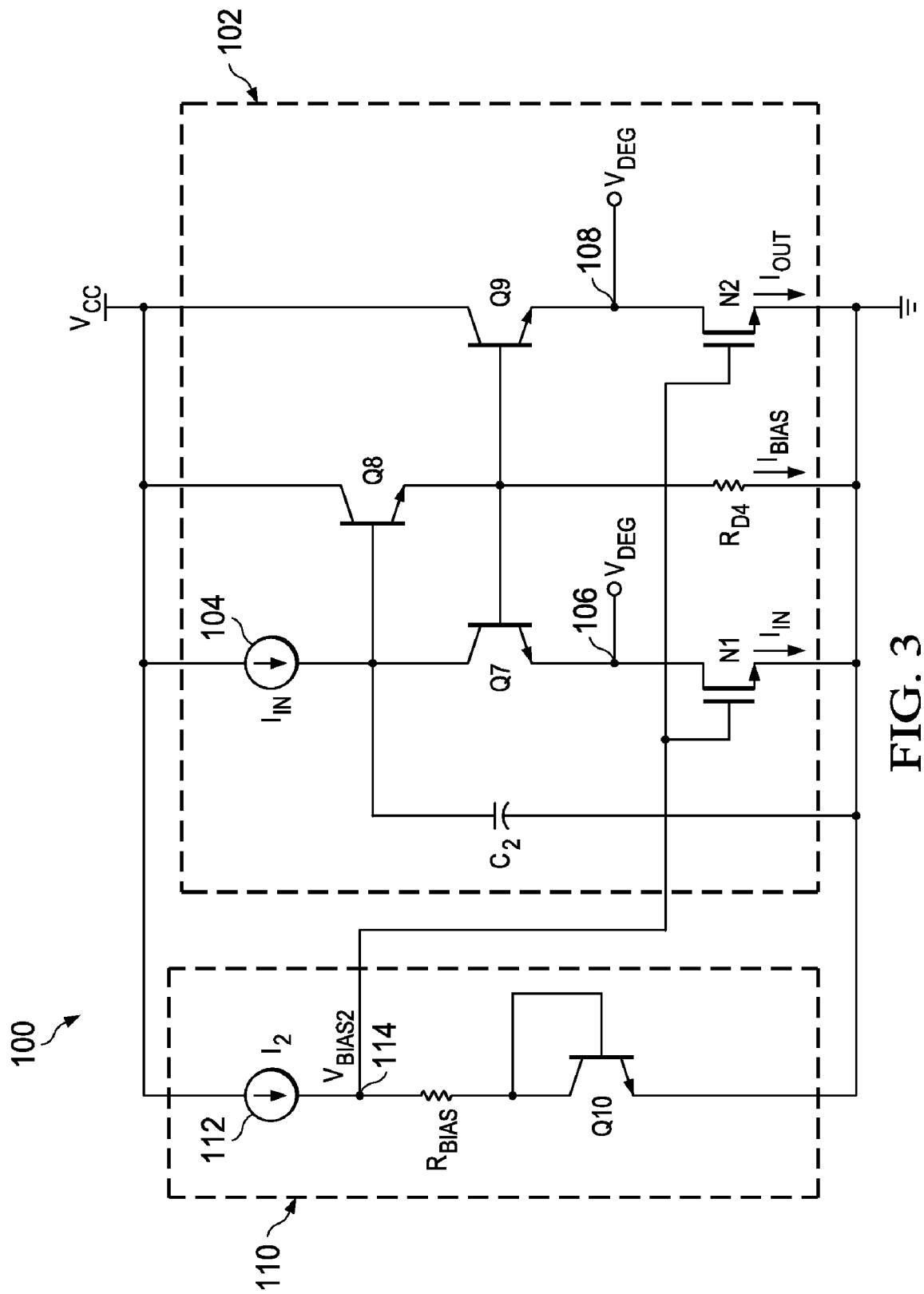
FIG. 3 illustrates yet another example of a current-mirror system in accordance with an aspect of the invention.

FIG. 3 illustrates an example of a current-mirror system 100 in accordance with an aspect of the invention. As an example, the current-mirror system 100 can be a more detailed example of the current-mirror system 10 in the example of FIG. 1.

The current-mirror system 100 includes a current-mirror circuit 102. The current-mirror circuit 102 includes a current source 104 that is configured to generate an input current $I_{IN}$. As an example, the current source 104 can be a current DAC, such as to generate the input current $I_{IN}$ at a magnitude that is set based on a digital signal (not shown). The input current $I_{IN}$ flows from the high rail voltage $V_{CC}$ through a first HBT Q7 through a first N-type degeneration transistor N1, demonstrated in the example of FIG. 3 as a MOSFET, that is coupled at a drain to an emitter of the first HBT Q7. The current-mirror circuit 102 also includes a second HBT Q8 that is configured to set a bias for the first HBT Q7. The second HBT Q8 has a base that is coupled to the collector of the first HBT Q7 and an emitter that is coupled to the base of the first HBT Q7. A current $I_{BIAS}$ flows through the second HBT and through a degeneration resistor $R_{D4}$, such that the first HBT Q7 remains activated and conducting the input current $I_{IN}$. In the example of FIG. 3, a capacitor $C_2$ interconnects the collector of the first HBT Q7 and ground, thus stabilizing the voltage at the collector of the first HBT Q7.

The current-mirror system 100 also includes a third HBT Q9 having a base that is coupled to the base of the first HBT Q7 and the emitter of the second HBT Q8. Thus, the output current $I_{OUT}$ flows from the high rail voltage $V_{CC}$ through the third HBT Q9 and through a second N-type degeneration transistor N2, demonstrated in the example of FIG. 3 as a MOSFET, that is coupled at a drain to an emitter of the third HBT Q9. The third HBT Q9 can have a size relationship relative to the first HBT Q7 that is defined by a proportionality constant. The magnitude of the output current $I_{OUT}$ can be proportional with respect to the magnitude of the input current $I_{IN}$ based on the proportionality constant. Furthermore, the second degeneration transistor N2 can have a size that is approximately equal to the size of the first degeneration transistor N1 times the proportionality constant. Accordingly, a degeneration voltage $V_{DEG}$ at a node 106 at the drain of the first degeneration transistor N1 approximates the degeneration voltage $V_{DEG}$ at a node 108 at the drain of the second degeneration transistor N2 relative to ground.

The current-mirror system 100 also includes a bias voltage circuit 110. The bias voltage circuit 110 includes a bias current source 112 that is configured to generate a bias current $I_2$. As an example, the bias current $I_2$ can have a magnitude that is proportional to the input current $I_{IN}$, such as having a scaled-down magnitude of the input current $I_{IN}$. The bias voltage circuit 110 also includes a fourth HBT Q10. The fourth HBT Q10 is diode-connected, such that the fourth HBT Q10 has a common base-collector. The bias voltage circuit 110 also includes a bias resistor $R_{BIAS}$ that interconnects the bias current source 112 and the fourth HBT Q10 at the common base-collector of the fourth HBT Q10. Therefore, based on the flow of the current $I_2$ through the bias resistor $R_{BIAS}$ and the fourth HBT Q10, a variable bias voltage $V_{BIAS2}$ is set at a node 114 between the bias current source 112 and the bias resistor $R_{BIAS}$.

The node 114 is also coupled to the gates of each of the first and second degeneration transistors N1 and N2. Therefore, each of the first and second degeneration transistors N1 and N2 is operated in the linear region according to the bias voltage $V_{BIAS2}$, which establishes a variable degeneration resistance for the degeneration transistors N1 and N2. Because the bias current $I_2$ has a magnitude that varies proportionally with the input current $I_{IN}$, the bias voltage $V_{BIAS2}$ likewise has a magnitude that varies proportionally with the input current $I_{IN}$. Accordingly, the resistance magnitude of each of the first and second degeneration transistors N1 and N2 varies inversely proportional to the input current $I_{IN}$ and the output current $I_{OUT}$. As a result, the degeneration voltage $V_{DEG}$ at the drain of each of the first and second degeneration transistors N1 and N2 remains substantially constant, regardless of the magnitudes of the input and output currents $I_{IN}$ and $I_{OUT}$.

More specifically, the drain current $I_D$ of a MOSFET operating in the linear region can be expressed by the following equation:

$$I_D = K' * \left(\frac{W}{L}\right) * \left[(V_{GS} - V_T) * V_{DS} - \frac{V_{DS}^2}{2}\right] \quad \text{Equation 1}$$

In order to generate a particular drain-source voltage (e.g., the degeneration voltage $V_{DEG}$), Equation 1 can be rewritten as follows:

$$V_{GS} = \left(\frac{L}{K' * W * V_{DE}}\right) * I_D + \left(V_T + \frac{V_{DS}}{2}\right) \quad \text{Equation 2}$$

Equation 2 can be rewritten as follows for the current-mirror system 100:

$$V_{BIAS} = \left(\frac{L}{K' * W * V_{DEG}}\right) * I_{IN} + \left(V_T + \frac{V_{DEG}}{2}\right) \quad \text{Equation 3}$$

Where:
- L is the gate length of the first degeneration transistor N1;
- W is the gate width of the first degeneration transistor N1;
- K' is a constant; and
- $V_T$ is a threshold voltage of the first degeneration transistor N1.

It is to be understood that Equation 3 likewise applies to the second degeneration transistor N2, replacing $I_{IN}$ for $I_{OUT}$ (and with possibly different values for W and/or L). Therefore, Equation 3 demonstrates a simple linear relationship between the bias voltage VBIAS and the input current $I_{IN}$ (and by extension, the output current $I_{OUT}$) to maintain the substantially constant magnitude of the degeneration voltage $V_{DEG}$. As a result, the proportionality of the output current $I_{OUT}$ relative to the input current $I_{IN}$ can be maintained across the entire range of input current $I_{IN}$. Accordingly, errors in the output current $I_{OUT}$ resulting from the size relationship of the HBTs Q7 and Q9 at very low magnitudes of the input current $I_{IN}$ can be substantially mitigated.

Figure 4:
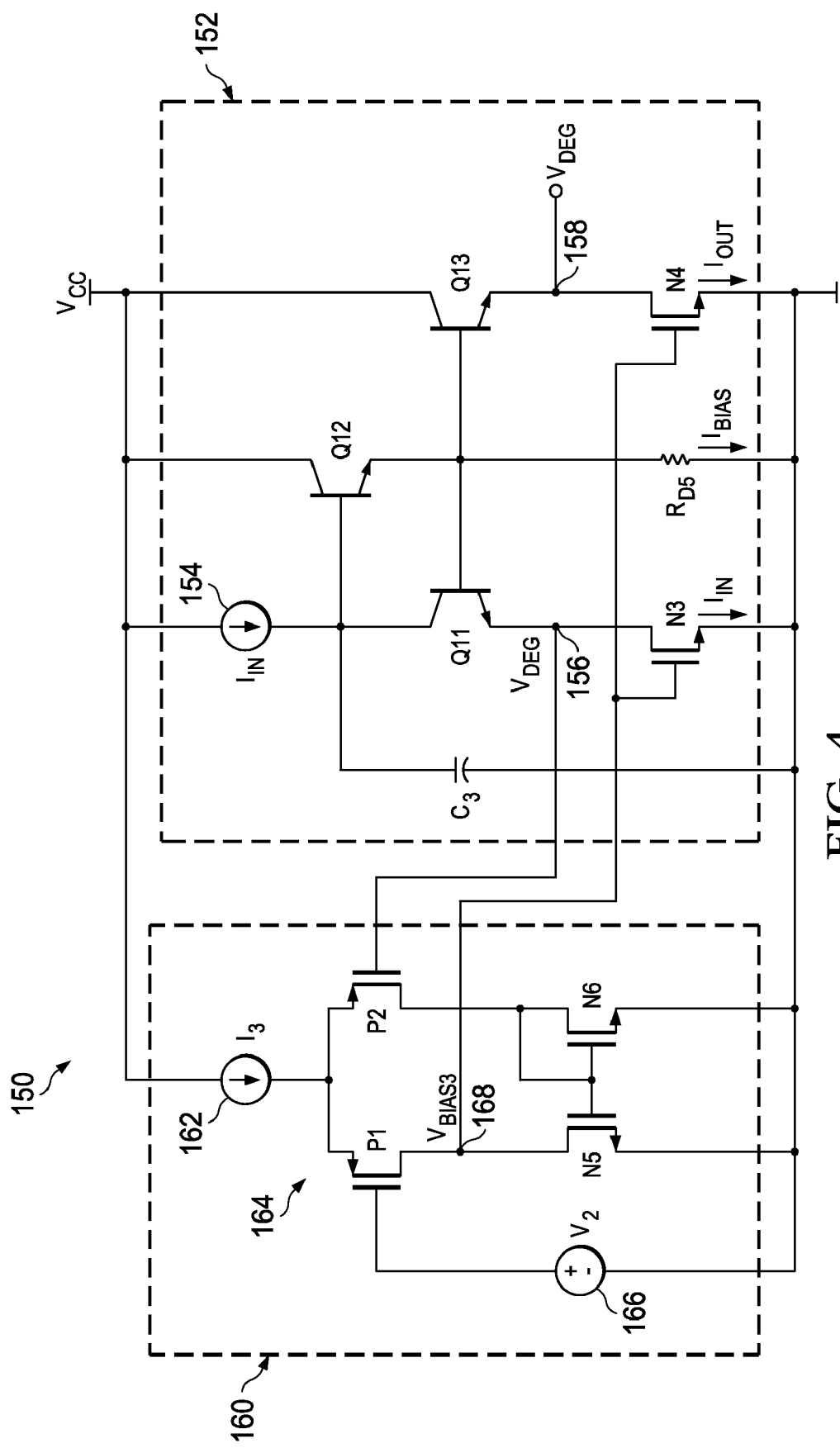
FIG. 4 illustrates yet a further example of a current-mirror system in accordance with an aspect of the invention.

FIG. 4 illustrates an example of a current-mirror system 150 in accordance with an aspect of the invention. As an example, the current-mirror system 150 can be a more detailed example of the current-mirror system 10 in the example of FIG. 1.

The current-mirror system 150 includes a current-mirror circuit 152. The current-mirror circuit 152 includes a current source 154 that is configured to generate an input current $I_{IN}$. As an example, the current source 154 can be a current DAC, such as to generate the input current $I_{IN}$ at a magnitude that is set based on a digital signal (not shown). The input current $I_{IN}$ flows from the high rail voltage $V_{CC}$ through a first HBT Q11 through a first N-type degeneration transistor N3, demonstrated in the example of FIG. 4 as a MOSFET, that is coupled at a drain to an emitter of the first HBT Q11. The current-mirror circuit 152 also includes a second HBT Q12 that is configured to set a bias for the first HBT Q11. The second HBT Q12 has a base that is coupled to the collector of the first HBT Q11 and an emitter that is coupled to a common base of the first HBT Q11 and a third HBT Q13. Therefore, a current $I_{BIAS}$ flows through the second HBT Q12 and through a degeneration resistor $R_{D5}$, such that the first HBT Q11 remains activated and conducting the input current $I_{IN}$. In addition, in the example of FIG. 4, a capacitor $C_3$ interconnects the collector of the first HBT Q11 and ground, thus stabilizing the voltage at the collector of the first HBT Q11.

The third HBT Q13 has a base that is coupled to the base of the first HBT Q11 and the emitter of the second HBT Q12. Thus, the output current $I_{OUT}$ flows from the high rail voltage $V_{CC}$ through the third HBT Q13 and through a second N-type degeneration transistor N4, demonstrated in the example of FIG. 4 as a MOSFET, that is coupled between an emitter of the third HBT Q13 and ground. The third HBT Q13 can have a size relationship relative to the first HBT Q11 that is defined by a proportionality constant. Therefore, the magnitude of the output current $I_{OUT}$ can be proportional with respect to the magnitude of the input current $I_{IN}$ based on the proportionality constant. Furthermore, the second degeneration transistor N4 can have a size that is approximately equal to the first degeneration transistor N3 times the proportionality constant. Accordingly, an approximately equal degeneration voltage $V_{DEG}$ is exhibited at a node 156 at the drain of the first degeneration transistor N3 relative and at a node 158 at the drain of the second degeneration transistor N4 relative to ground.

The current-mirror system 150 also includes a bias voltage/feedback circuit 160. The bias voltage/feedback circuit 160 includes a bias current source 162 that is configured to generate a bias current $I_3$. As an example, the bias current $I_3$ can be substantially constant. The bias voltage/feedback circuit 160 also includes a differential amplifier 164 through which the bias current $I_3$ flows. The differential amplifier 164 includes a pair of P-type FETs P1 and P2 having a common source. In the example of FIG. 4, a gate of the P-FET P1 is controlled by a bias voltage source 166 that generates a voltage $V_2$ that can have a magnitude that is set to a desired magnitude of the degeneration voltage $V_{DEG}$, and that can be static or programmable. The P-FET P2 has a gate that is coupled to the node 156, such that the P-FET P2 is biased by the degeneration voltage $V_{DEG}$. The differential amplifier 164 also includes a pair of N-type FETs N5 and N6 that are arranged in a current-mirror configuration and that have drains coupled to the drains of the P-FETs P1 and P2. A node 168 interconnecting the drains of the N-FET N5 and the P-FET P1 operates as an output of the differential amplifier 164 which is coupled to the gates of the first and second degeneration transistors N3 and N4.

The node 168 is coupled to the gates of the first and second degeneration transistors N3 and N4 to provide a bias voltage $V_{BIAS3}$. The resistance magnitude of each of the first and second degeneration transistors N3 and N4 is therefore set by the bias voltage $V_{BIAS3}$, similar to as described above in the example of FIG. 3. Accordingly, the resistance magnitude of each of the first and second degeneration transistors N3 and N4 varies inversely proportional to the input current $I_{IN}$ and the output current $I_{OUT}$. As a result, the degeneration voltage $V_{DEG}$ at the drain of each of the first and second degeneration transistors N3 and N4 remains substantially constant, regardless of the magnitudes of the input and output currents $I_{IN}$ and $I_{OUT}$.

In addition, because the degeneration voltage $V_{DEG}$ is provided to the gate of the P-FET P2 as a feedback voltage, the differential amplifier 164 is thus configured to generate a magnitude of the bias voltage $V_{BIAS3}$ that maintains the magnitude of the degeneration voltage $V_{DEG}$ at the node 156 to be substantially equal to the voltage $V_2$, and thus substantially equal to the desired magnitude of the degeneration voltage $V_{DEG}$. The current-mirror system 150 thus demonstrates a substantially more accurate manner of maintaining the substantially constant magnitude of the degeneration voltage $V_{DEG}$. As a result, the proportionality of the output current $I_{OUT}$ relative to the input current $I_{IN}$ can be maintained across the entire range of input current $I_{IN}$. Accordingly, errors in the output current $I_{OUT}$ resulting from the size relationship of the HBTs Q11 and Q13 at very low magnitudes of the input current $I_{IN}$ can be substantially mitigated.

It is to be understood that the current-mirror systems 100 and 150 are not intended to be limited to the examples of FIGS. 3 and 4, respectively. As an example, degeneration resistors can be coupled in series to each of the degeneration transistors N1 and N2 in the example of FIG. 3, and to each of the degeneration transistors N3 and N4 in the example of FIG. 4. Therefore, the current-mirror systems 100 and 150 can include a hybrid connection of degeneration transistors and resistors to maintain the substantially constant magnitude of the degeneration voltage $V_{DEG}$. Therefore, the current-mirror systems 100 and 150 can be configured in any of a variety of ways.

Figure 5:
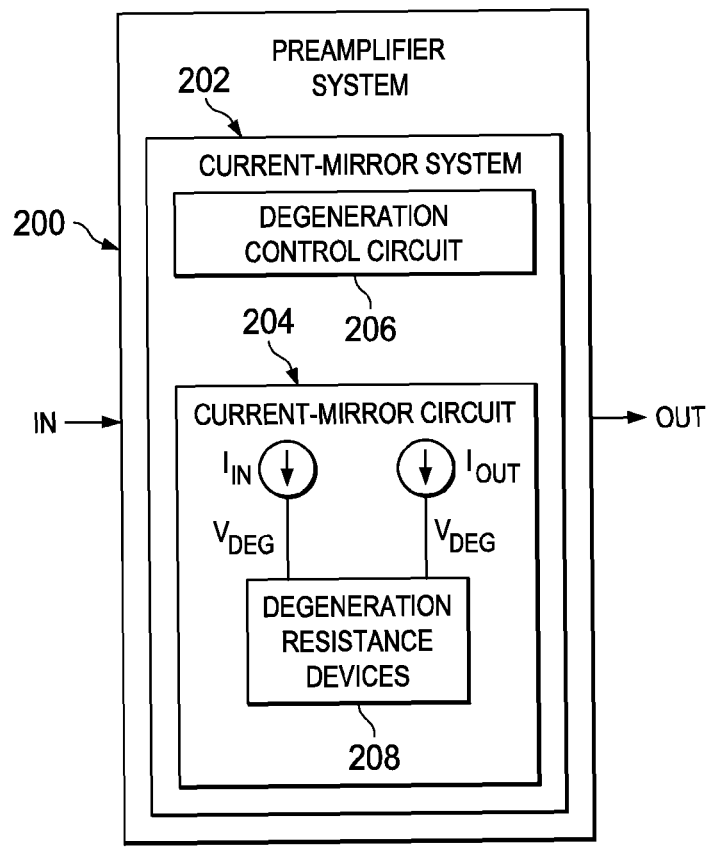
FIG. 5 illustrates an example of a preamplifier system in accordance with an aspect of the invention.

FIG. 5 illustrates an example of a preamplifier system 200 in accordance with an aspect of the invention. The preamplifier system 200 can be implemented in any of a variety of applications, such as audio and/or communications signal processing applications or magnetic disk-drive applications. The preamplifier system 200 is demonstrated as receiving an input signal IN and generating a signal OUT corresponding to an amplified version of the input signal IN. The input signal IN can be an analog signal that is provided from magneto-electric source, such as an antenna or a magnetic disk. Therefore, the signal OUT can be provided to an additional amplification stage or to a signal processor.

The preamplifier system 200 includes a current-mirror system 202. The current-mirror system 202 includes a current-mirror circuit 204 that generates an output current $I_{OUT}$ having a magnitude that is proportional to an input current $I_{IN}$. The current-mirror system 202 also includes a degeneration control circuit 206 that is configured to set a substantially constant magnitude of a degeneration voltage across degeneration resistance devices 208 in the current-mirror circuit 204. The current-mirror system 202 can be configured substantially similar to any of the current-mirror systems 50, 100, or 150 described above in the examples of FIGS. 2, 3, and 4, respectively.

As an example, the degeneration control circuit 206 can be configured as a current compensation circuit, such as demonstrated in the examples of FIGS. 2 and 3, that generates compensation currents that are added to each of an input and output currents $I_{IN}$ and $I_{OUT}$ to maintain a substantially constant degeneration voltage magnitude across the degeneration resistance devices 208 that can be configured as a respective set of degeneration resistors. As another example, the degeneration control circuit 206 can be configured as a bias voltage circuit, such as demonstrated in the example of FIG. 3, that generates a bias voltage that controls the degeneration resistance devices 208 that can be configured as a respective set of degeneration transistors. Thus, the degeneration transistors can have a resistance magnitude that varies indirectly proportional with the input and output currents $I_{IN}$ and $I_{OUT}$ to maintain a substantially constant degeneration voltage magnitude across the degeneration transistors. As yet another example, the bias voltage circuit can include feedback closed-loop control, such as demonstrated in the example of FIG. 4, that receives a feedback voltage associated with the degeneration voltage and generates the bias voltage that controls the respective set of degeneration transistors based on the feedback voltage. Therefore, the preamplifier system 200 can be configured in any of a variety of ways.

Figure 6:
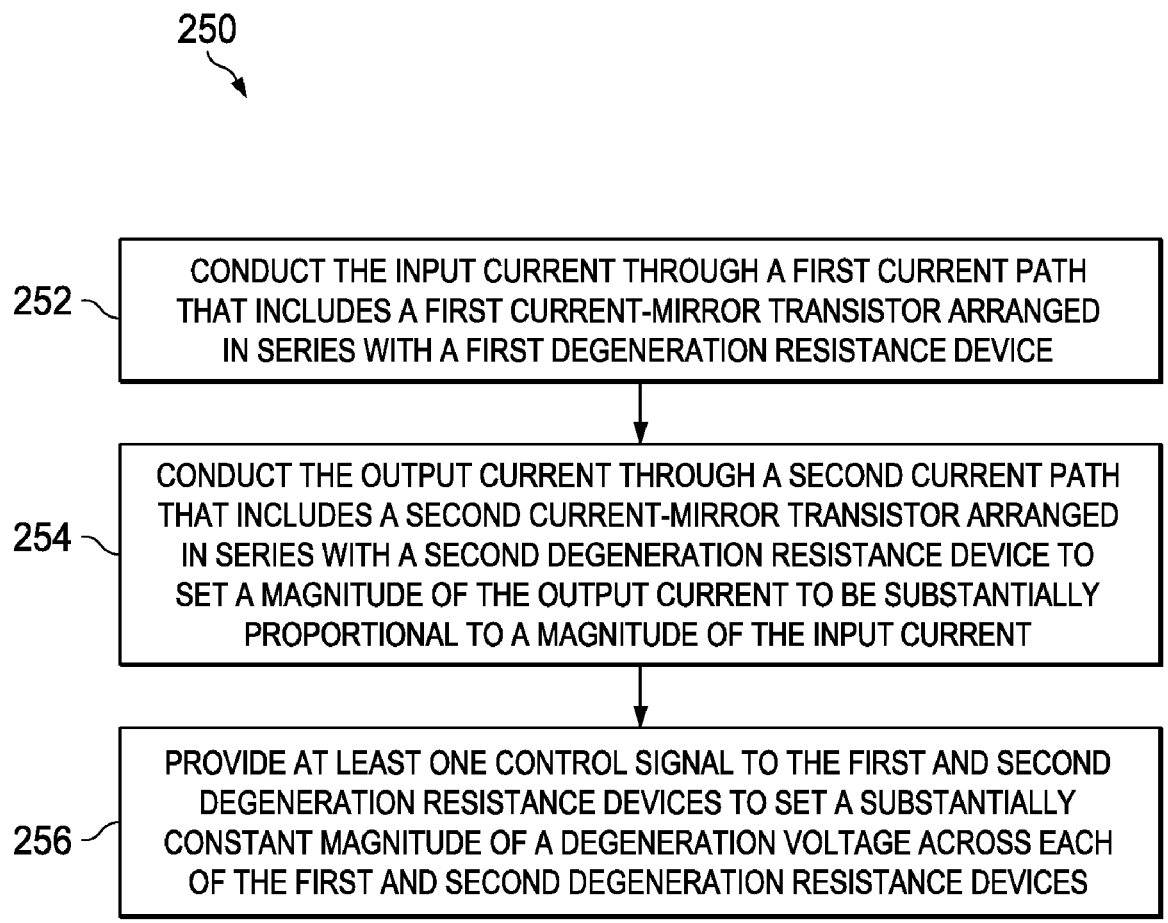
FIG. 6 illustrates a method for mirroring an input current to generate an output current in accordance with an aspect of the invention.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method.

FIG. 6 illustrates a method 250 for mirroring an input current to generate an output current in accordance with an aspect of the invention. At 252, the input current is conducted through a first current path that includes a first current-mirror transistor arranged in series with a first degeneration resistance device. The first current-mirror transistor can be an HBT device. The first degeneration resistance device can be either a substantially constant resistance device, such as a resistor, or could be a variable resistance device, such as a MOSFET.

At 254, the output current is conducted through a second current path that includes a second current-mirror transistor arranged in series with a second degeneration resistance device to set a magnitude of the output current to be substantially proportional to a magnitude of the input current. The second current-mirror transistor can be an HBT device. The second degeneration resistance device can have substantially the same electronic circuit characteristics as the first degeneration resistance device, and thus either a substantially constant resistance device, such as a resistor, or a variable resistance device, such as a MOSFET. The magnitude of the output current can be proportional to the input current by a proportionality constant. The first and second degeneration resistance devices can likewise differ in resistance by the proportionality constant, such that the second degeneration resistance device can have a resistance that is approximately equal to the resistance of the first degeneration resistance device divided by the proportionality constant.

At 256, at least one control signal is provided to the first and second degeneration resistance devices to set a substantially constant magnitude of a degeneration voltage across each of the first and second degeneration resistance devices. The degeneration voltages across each of the first and second degeneration resistance devices can be approximately equal. For the degeneration resistance devices being resistors, the at least one control signal can be a pair of compensation currents that are respectively added to the input and output currents, thus maintaining a substantially constant current flow through the first and second degeneration resistors. For the degeneration resistance devices being transistors, the at least one control signal can be a bias voltage that sets a variable resistance of the first and second degeneration transistors that is inversely proportional with the respective input and output currents. Additionally, the bias voltage can be generated in a closed-loop manner, such as by a differential amplifier, which is based on the degeneration voltage.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A current-mirror system comprising:
   a current-mirror circuit configured to conduct an input current through a first current path that includes a first degeneration resistance device and to generate an output current that flows through a second current path that includes a second degeneration resistance device, the output current being substantially proportional to the input current; and
   a degeneration control circuit configured to maintain a substantially constant degeneration voltage across each of the first and second degeneration resistance devices.

2. The system of claim 1, wherein each the first and second degeneration resistance devices comprises a first degeneration resistor and a second degeneration resistor, respectively.

3. The system of claim 2, wherein the degeneration control circuit comprises a current compensation circuit configured to maintain a first substantially constant current across the first degeneration resistor and a second substantially constant current across the second degeneration resistor, such that the substantially constant degeneration voltage is provided across each of the first and second degeneration resistors.

4. The system of claim 3, wherein the current compensation circuit comprises:
a first current source transistor configured to generate a first compensation current, the first current source transistor being connected to supply the first compensation current to the input current to provide the first substantially constant current; and
a second current source transistor configured to generate a second compensation current, the second current source transistor being connected to supply the second compensation current to the output current to provide the second substantially constant current.

5. The system of claim 4, wherein the degeneration control circuit further comprises bias generating circuitry configured to provide a substantially constant bias voltage that controls each of the first and second current source transistors.

6. The system of claim 1, wherein the first degeneration resistance device and the second degeneration resistance device comprise a first degeneration transistor and a second degeneration transistor, respectively.

7. The system of claim 6, wherein the degeneration control circuit comprise a bias voltage circuit that is configured to generate a bias voltage having a magnitude that sets a resistance for each of the first and second degeneration transistors that is inversely proportional to the input current such that the substantially constant degeneration voltage is maintained across each of the first and second degeneration transistors.

8. The system of claim 7, wherein the bias voltage circuit comprises a bias current source configured to generate a bias current that is proportional to the input current across a bias resistor to set the magnitude of the bias voltage.

9. The system of claim 7, wherein the bias voltage circuit is configured to set the magnitude of the bias voltage based on the magnitude of the substantially constant degeneration voltage in a closed-loop manner.

10. The system of claim 9, wherein the bias voltage circuit comprises a differential amplifier configured to receive the substantially constant degeneration voltage across the first degeneration transistor as a feedback signal, the differential amplifier setting the magnitude of the bias voltage based on the magnitude of the substantially constant degeneration voltage.

11. A pre-amplifier system comprising the current-mirror system of claim 1.

12. A method for mirroring an input current to generate an output current, the method comprising:
conducting the input current through a first current path that includes a first transistor arranged in series with a first degeneration resistance device;
conducting the output current through a second current path that includes a second transistor arranged in series with a second degeneration resistance device to set the output current to be substantially proportional to the input current, the first transistor being connected with the second transistor as a current-mirror; and
providing at least one control signal to the first and second degeneration resistance devices to set a substantially constant degeneration voltage across each of the first and second degeneration resistance devices.

13. The method of claim 12, wherein the first and second degeneration resistance devices are configured as a first degeneration resistor and a second degeneration resistor, respectively, the method further comprising:
generating a first compensation current that is added to the input current to generate a substantially constant current through the first degeneration resistor to provide the substantially constant degeneration voltage across the first degeneration resistor; and
generating a second compensation current that is added to the output current to generate a substantially constant current through the second degeneration resistor to provide the substantially constant degeneration voltage across the second degeneration resistor.

14. The method of claim 12, wherein the first degeneration resistance device and the second degeneration resistance device are configured as a first degeneration transistor and a second degeneration transistor, respectively, the method further comprising generating a bias voltage to control each of the first and second degeneration transistors to have a resistance that is inversely proportional to the input current.

15. The method of claim 14, further comprising generating a bias current that is proportional to the input current across a bias resistor to set the bias voltage.

16. The method of claim 14, further comprising:
monitoring a magnitude of the substantially constant degeneration voltage across the first degeneration transistor; and
setting the magnitude of the bias voltage based on the magnitude of the substantially constant degeneration voltage across the first degeneration transistor.

17. A current-mirror system comprising:
means for generating an input current through a first degeneration resistance device;
means for generating an output current having a magnitude that is substantially proportional the input current through a second degeneration resistance device;
means for maintaining a substantially constant degeneration voltage at a first output node that is connected with the means for generating the input current; and
means for maintaining the substantially constant degeneration voltage at a second output node that is connected with the means for generating the output current.

18. The system of claim 17, wherein the means for maintaining the substantially constant degeneration voltage at the first output node comprises means for setting a substantially constant resistance between the first output node and a first voltage rail, wherein the means for maintaining the substantially constant degeneration voltage at the second output node comprises means for setting the substantially constant resistance between the second output node and the first voltage rail, the system further comprising:
means for generating a first compensation current that is added to the input current to generate a substantially constant current through the means for maintaining the substantially constant degeneration voltage at the first output node; and
means for generating a second compensation current that is added to the input current to generate a substantially constant current flow through the means for maintaining the substantially constant degeneration voltage at the second output node.

19. The system of claim 17, wherein the means for maintaining the substantially constant degeneration voltage at the first output node comprises means for providing a first variable resistance between the first output node and a voltage rail, and wherein the means for maintaining the substantially constant degeneration voltage at the second output node comprises means for providing a second variable resistance between the second output node and the voltage rail, the system further comprising means for generating a bias voltage that is provided to set the first and second variable resistance to be inversely proportional to the input current.

20. The system of claim 19, wherein the means for generating the bias voltage comprises:

means for monitoring the substantially constant degeneration voltage; and means for generating the bias voltage in response to the monitored substantially constant degeneration voltage.

* * * * *